US008551560B2

(12) United States Patent
Tong et al.

(10) Patent No.: US 8,551,560 B2
(45) Date of Patent: *Oct. 8, 2013

(54) METHODS FOR IMPROVING SELECTIVITY OF ELECTROLESS DEPOSITION PROCESSES

(75) Inventors: Jinhong Tong, Santa Clara, CA (US); Zhi-Wen Sun, San Jose, CA (US); Chi-I Lang, Sunnyvale, CA (US); Nitin Kumar, Menlo Park, CA (US); Bob Kong, San Jose, CA (US); Zachary Fresco, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 386 days.

This patent is subject to a terminal disclaimer.

(21) Appl. No.: 12/471,310

(22) Filed: May 22, 2009

(65) Prior Publication Data

US 2009/0291275 A1 Nov. 26, 2009

Related U.S. Application Data

(60) Provisional application No. 61/055,828, filed on May 23, 2008.

(51) Int. Cl.
  *C23C 18/18* (2006.01)
  *C23C 18/34* (2006.01)
  *C23C 18/36* (2006.01)
  *C23C 18/50* (2006.01)

(52) U.S. Cl.
  USPC ........ 427/98.5; 427/98.6; 427/99.5; 427/282; 427/437; 427/443.1

(58) Field of Classification Search
  USPC ........................................ 427/97.3
  See application file for complete search history.

(56) References Cited

U.S. PATENT DOCUMENTS

| 4,929,616 | A | * | 5/1990 | Binder et al. ............ 514/252.19 |
| 5,971,071 | A | * | 10/1999 | Mariaggi et al. ............... 166/295 |
| 5,990,127 | A | * | 11/1999 | Meiwes et al. ................ 514/317 |
| 5,993,116 | A | * | 11/1999 | Paxton et al. .............. 405/259.6 |
| 6,008,317 | A | * | 12/1999 | Lai et al. ........................ 528/374 |
| 6,183,545 | B1 | * | 2/2001 | Okuhama et al. ............ 106/1.18 |
| 6,641,899 | B1 | * | 11/2003 | Colburn et al. ............... 428/209 |
| 6,902,605 | B2 | * | 6/2005 | Kolics et al. ................. 106/1.22 |
| 7,749,881 | B2 | * | 7/2010 | Lazovsky et al. ............ 438/597 |
| 7,879,710 | B2 | * | 2/2011 | Fresco et al. ................. 438/597 |
| 2006/0228488 | A1 | * | 10/2006 | Sung et al. .................... 427/437 |

(Continued)

FOREIGN PATENT DOCUMENTS

| WO | 2006/033465 | * | 3/2006 |
| WO | 2006/070857 | * | 7/2006 |

*Primary Examiner* — Katherine A Bareford (57) ABSTRACT

Methods for improving selective deposition of a capping layer on a patterned substrate are presented, the method including: receiving the patterned substrate, the patterned substrate including a conductive region and a dielectric region; forming a molecular masking layer (MML) on the dielectric region; preparing an electroless (ELESS) plating bath, where the ELESS plating bath includes: a cobalt (Co) ion source: a complexing agent: a buffer: a tungsten (W) ion source: and a reducing agent; and reacting the patterned substrate with the ELESS plating bath for an ELESS period at an ELESS temperature and an ELESS pH so that the capping layer is selectively formed on the conductive region. In some embodiments, methods further include a pH adjuster for adjusting the ELESS pH to a range of approximately 9.0 pH to 9.2 pH. In some embodiments, the pH adjuster is tetramethylammonium hydroxide (TMAH). In some embodiments, the MML is hydrophilic.

12 Claims, 3 Drawing Sheets

(56) References Cited

U.S. PATENT DOCUMENTS

| | | | |
|---|---|---|---|
| 2006/0280860 A1* | 12/2006 | Paneccasio et al. | 427/99.5 |
| 2007/0166989 A1* | 7/2007 | Fresco et al. | 438/597 |
| 2008/0067679 A1* | 3/2008 | Takagi et al. | 257/751 |
| 2008/0290249 A1* | 11/2008 | Hidaka et al. | 249/134 |
| 2009/0075095 A1* | 3/2009 | Ivanov et al. | 428/446 |

* cited by examiner

METHODS FOR IMPROVING SELECTIVITY OF ELECTROLESS DEPOSITION PROCESSES

BACKGROUND

Electroless (ELESS) CoWPB alloy deposition methods are under intensive investigation for providing capping layers for Cu metallization to improve Cu electromigration time in Ultra Large Scale Integration (ULSI) applications. Capping layers, as are generally well-known, may be utilized to prevent diffusion of conductive materials into subsequent layers. Despite the utility of a capping layer, without adequate process control, capping layer deposition may have undesirable results. For example, if too much capping layer material is deposited on narrow serpentine or comb structure patterns, undesirable lateral growth and mushroom formation may occur thus potentially causing increases in current leakage and electrical shorts. Typically, thin film CoWPB depositions having a thickness of less than approximately 100 Å may be required for 45 nm or 32 nm node applications. In order to achieve uniform CoWPB film depositions within required tolerances, improving ELESS plating processes and process chemistries may be desirable.

For example, one reason for the interest in CoWPB alloy deposition is due to the alloy's characteristic deposition selectivity. It is generally accepted that deposition selectivity is at least partially achieved by self-initiating autocatalytic deposition on patterned metal surfaces over dielectric surfaces. By utilizing CoWPB alloys, ELESS plating processes may be selectively enhanced on conductive surfaces. However, in some conventional solutions, nucleation sites located on dielectric surfaces may cause undesirable deposition of capping layer materials on dielectric surfaces. Thus, improving ELESS plating processes may be useful.

In another example, in some conventional applications, ELESS CoWPB plating solutions can decompose spontaneously with an increase in the volume of hydrogen gas evolution as indicated by an appearance of a black precipitate in a bulk solution. Stabilizers may be utilized in ELESS process chemistries to prevent spontaneous decomposition and uncontrollable metal precipitation. Conventional stabilizers may be divided into the following classes: (1) Heavy metals such as Sn, Pb, Cd; (2) Unsaturated organic acids: Maleic acid, itaconic acid; (3) Compound containing oxygen: $Ca(SO_4)_2$, $Mo(SO_4)_2$. However, conventional stabilizers may not, in all cases, provide adequate stabilization of ELESS plating solutions. Thus, improving ELESS process chemistries may be useful.

In still another example, in some conventional applications, bubbles may form on reactive surfaces which may otherwise lead to non-uniform deposition. Surfactants may be utilized in ELESS process chemistries to reduce the surface tension between the substrate and ELESS plating solutions to prevent bubbles from forming on the surface, which could otherwise lead to non-uniform deposition. Again, improving ELESS process chemistries may be useful.

As such, methods for improving selectivity of electroless deposition processes are provided herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As noted above, in order to achieve uniform CoWPB film depositions within required tolerances, improved control of electroless (ELESS) plating processes and process chemistries may be desirable. As may be appreciated, an ELESS plating bath may consist of many components such as: a source of metal ions, reducing agents, complexing agents, buffers, pH adjusters, surfactants and stabilizers. The plating rate (or rate of deposition) depends on a number of factors, such as plating temperature, the pH of the solution and concentration of the reducing agents, which are the effective parameters that may be adjusted to control the plating rate.

In some embodiments ELESS plating baths may utilize no surfactants or stabilizers. In other embodiments, ELESS plating baths may utilize both surfactants and stabilizers to improve bath stability. In all embodiments, a molecular mask layer (MML) may be utilized in an integration process to improve CoWPB film deposition selectivity. An MML may be selectively deposited on dielectric regions of a patterned substrate to lower the contact angle of the dielectric regions, therefore reducing the surface tension between ELESS plating solutions and the patterned substrate, resulting in more uniform plating. In some embodiments, precise control of ELESS plating bath pH may be desirable to optimize depositions of capping layers.

Figure 1:
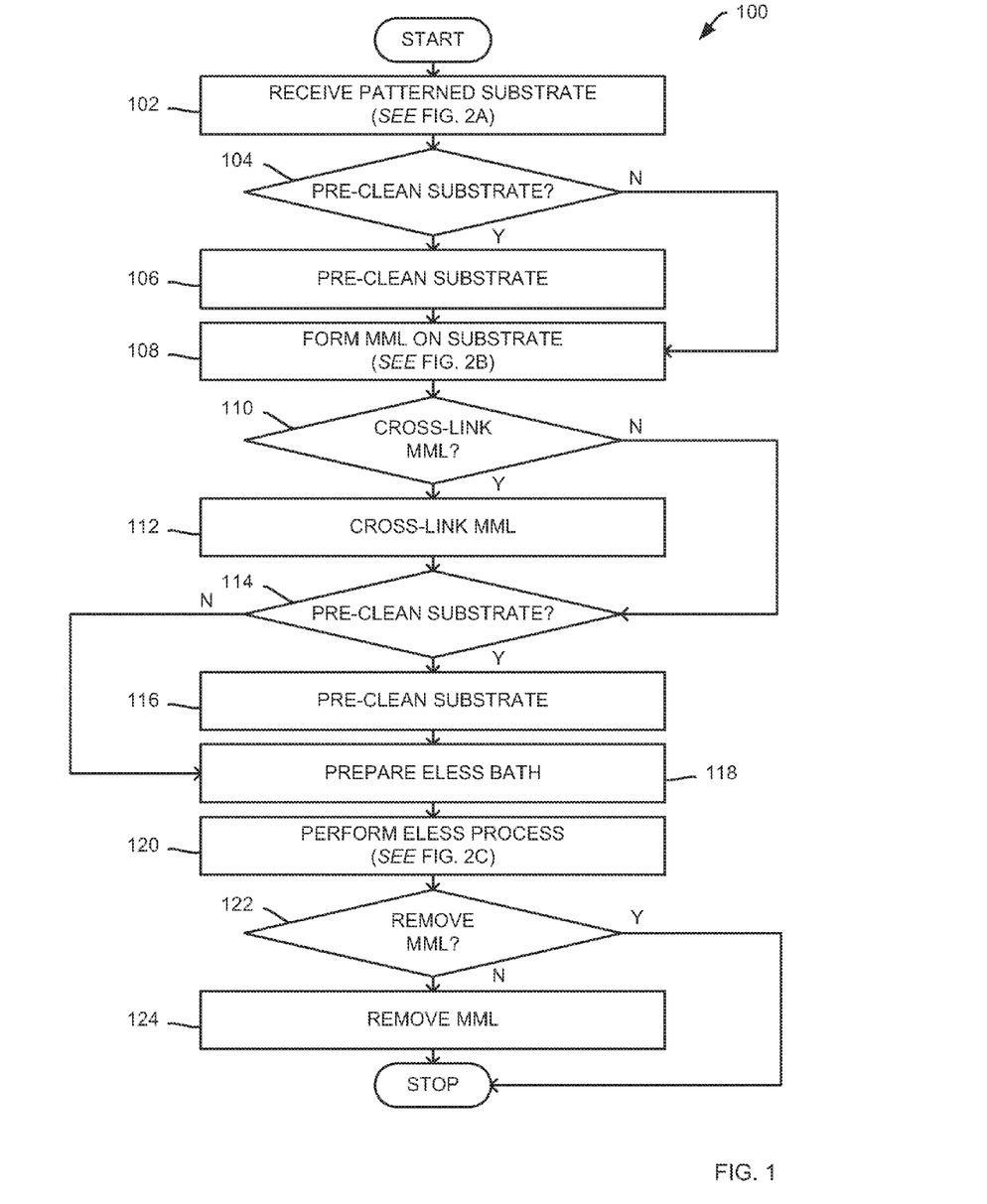
FIG. 1 is an illustrative flow chart of methods for improving selective deposition of a capping layer on a patterned substrate in accordance with embodiments of the present invention.

FIG. 1 is an illustrative flow chart 100 of methods for improving selective deposition of a capping layer on a patterned substrate in accordance with embodiments of the present invention. At a first step 102, a patterned substrate is received. A patterned substrate may include conductive regions and dielectric regions, which regions may be a comb, serpentine, or otherwise patterned without limitation without departing from the present invention. In some embodiments, dielectric materials may include: low-k porous dielectric material, low-k non-porous dielectric material, SiCN, SiCNH, $SiCH_3$, $SiOCH_3$, SiCOH, porous SiCOH, SiN, SiC, $SiO_2$, fluorinated silica glass (FSG), methyl-silsesquioxane (MSQ), SiLK™ dielectric by Dow Chemical of Midland, Mich., parylene, low-k organic polymers, and other similar materials or combinations thereof. In some embodiments, low-k porous dielectrics may be utilized, having a k value of less than approximately 3.0. Additionally, dielectric regions may include a hard mask layer which is often formed of a silicon-based material like $SiC_x$, $SiN_x$, $SiC_xN_y$, etc., where the variables x and y represent values as appropriate for desired compositions, formed at the surface of low-k dielectric regions. In addition, in some embodiments, conductive regions may include: copper, aluminum, and other metals and alloys including copper alloys such as copper-zinc alloys, copper-calcium alloys, and copper-manganese alloys, or some combination thereof without limitation and without departing from the present invention.

At a next step 104, the method determines whether to pre-clean the substrate. In some embodiments, it may be desirable to pre-clean a substrate before further processing. If the method determines at a step 104 to pre-clean the substrate, the method continues to a step 106 to pre-clean the substrate. In some embodiments, prior to depositing an MML on exposed surfaces of a substrate, the substrate surface may be prepared for processing in a preparation process that contains at least one or more cleaning steps (e.g., a deionized water rinse and/or any of a variety of other well-known surface cleaning step(s)) to remove contaminants left from previous processing. If the method determines at a step 104 not to pre-clean the substrate, the method continues to a step 108.

At a next step 108, an MML is formed on a patterned substrate. An MML may be formed on a patterned substrate in any manner known in the art without departing from the present invention. In some embodiments, an MML may include: amphiphilic macromolecules, polyvinyl alcohol (PVA), modified starch compounds, protein compounds, diblock copolymers, triblock copolymers, and dendrimers. In some embodiments, a PVA MML may further include a co-polymer such as: co-ethylene, co-cation, co-siloxane, co-anion (88% hydrolyzed), and co-anion (80% hydrolyzed). In addition, in some embodiments, MMLs may include compounds such as amines, alcohols, isolated silanols, vicinal silanols, and geminal silanols without departing from the present invention. In some embodiments, silanols are compounds having the formula: $R-X-Si(OH)_3$, where R is a hydrophobic group having a formula $O(C_2H_4O)_m\ CH_3$, where m=an integer greater than zero; and X is an organic group having a formula $(CH_2)_n$, where n=an integer greater than zero. In some embodiments, R is a hydrophilic group. In some embodiments, an MML may include a composition having the formula $C_n-Si-DMA$, where n=4, 8, 12, and 18, which may exhibit protective characteristics when utilized in combination with various aqueous processes. In some embodiments, the MML is hydrophilic.

After forming an MML on the substrate at a step 108, the method determines whether cross-linking is desired at a step 112. If the method determines that cross-linking is desired at a step 110, the method continues to a step 112 to cross-link an MML. In some embodiments, cross-linking may provide a more stable MML and may be desirable in some applications where harsh aqueous processes (e.g., high temperature processes or high pH conditions) are anticipated. Cross-linking processes may be performed by chemical cure and by non-chemical cure. Cross-linking agents that may be utilized for a chemical cure of an MML may include: glutaraldehyde, dialdehydes, sulfuric acid ($H_2SO_4$), maleic acid, citric acid, tetrabutylammonium acetate, and ascorbic acid without departing from the present invention. In some embodiments, a chemical cure occurs over a cross-linking period in a range of approximately 30 seconds to 600 seconds. A non-chemical cure of an MML may include: a deep ultra-violet cure, an ebeam cure, a thermal cure, and a plasma treatment cure without departing from the present invention. In some embodiments, a thermal cure occurs at a cure temperature of approximately 120° C. to 300° C. over a cure period of approximately 300 seconds.

After cross-linking at a step 112, the method continues to a step 114. Furthermore, if the method determines at a step 110 that cross-linking is not desired, the method continues to a step 114. At a next step 114, the method determines whether to pre-clean the substrate for a subsequent process. If the method determines at a step 114 to pre-clean the substrate, the method continues to a step 116 to pre-clean the substrate. In some embodiments, it may be desirable to pre-clean a substrate before further processing to prepare conductive surfaces or to remove any excess, unattached MML. In some embodiments, in order to prevent removal of all MML (including MML formed on dielectric region surfaces), such a pre-clean step may be accomplished utilizing an aqueous solution at a temperature lower or higher than what is required to dissolve or otherwise release the MML. In some embodiments, pre-cleaning the substrate may include washing step that utilizes a dilute oxalic acid solution that includes CoppeReady™ CP72B by Air Products and Chemicals, Inc. of Allentown, Pa. for approximately 30 seconds followed by a rinsing step that utilizes an approximately 2% citric acid solution for approximately 30 seconds.

After pre-cleaning at a step 116, the method continues to a step 118. Furthermore, if the method determines at a step 114 not to pre-clean the substrate, the method continues to a step 118. At a next step 118, the method prepares an ELESS plating bath. An ELESS plating bath may be utilized in an ELESS process for forming a capping layer on a conductive layer. An ELESS plating bath may include many components. As noted above, in some embodiments, no surfactants or stabilizers may be utilized in an ELESS plating bath. In those embodiments, ELESS plating baths may include: a cobalt (Co) ion source, such as $CoSO_4$ and $Co(OH)_2$; a complexing agent; a buffer; a tungsten (W) ion source; and a reducing agent. The reducing agent may be more than one compound and may also be a phosphorous (P) source or a boron (B) source. In one embodiment, the Co ion source includes an approximately 0.02M to 0.1M solution of $Co(OH)_2$ more preferably 0.035M solution of $Co(OH)_2$; the complexing agent includes an approximately 0.1M to 0.50M solution of citric acid, more preferably 0.21M solution of citric acid; the buffer includes an approximately 0.1M to 0.50M solution of boric acid, more preferably 0.15M solution of boric acid; the W ion source includes an approximately 0.01M to 0.10M solution of $WO_3$ in tetramethylammonium hydroxide (TMAH), more preferably 0.035M solution of $WO_3$; and the reducing agent is formed of two components, a P source including an approximately 0.1M to 0.5M solution of hypophosphorous acid, more preferably 0.145M solution of hypophosphorous acid and a B source including an approximately 0.01 M to 0.10M solution of dimethylamine borane (DMAB) more preferably 0.023M solution of DMAB.

In other embodiments, a surfactant and a stabilizer may be included in the ELESS bath formulation to improve ELESS bath stability. It may be appreciated that stabilizers and surfactants may be utilized to prevent the spontaneous decomposition and uncontrollable metal precipitation in ELESS plating bath embodiments described above. Conventional stabilizers may be divided into the following classes: (1) Heavy metals such as Sn, Pb, Cd; (2) Unsaturated organic acids: Maleic acid, itaconic acid; and (3) Compound containing oxygen: Ca(SO4)2, Mo(SO4)2. Embodiments of the present invention utilize another class of stabilizer, namely 2-mercapto benzothiazole (MBT).

Without being bound by theory, it is proposed that the adsorption of MBT onto a catalytic surface may inhibit the following reaction:

$$CoOH^+ + H_2O \rightarrow [Co(OH)_2]_{aq} + H \quad (1)$$

Where Hydrolyzed $Co^{2+}$ species can desorb from the catalytic surface into the double layer, forming colloidal particles.

$$Co^{2+} + H_2PO_2^- + OH^- \rightarrow Co^0 + HPO_3^{2-} + H^+ + H_2 \quad (2)$$

Where localized Co precipitate acts as a highly efficient catalyst nuclei to trigger the subsequent self-accelerating chain reaction resulting in a blackish precipitation In addition, surfactants may be utilized to reduce the surface tension between a substrate and an ELESS plating bath. Surfactants may also prevent bubbles from forming on the surface, which could otherwise lead to non-uniform deposition. Conventional surfactants used in the electroless Ni and Co plating are Triton-100 or RE-610. Some embodiments of the present invention utilize a cationic surfactant: Hexadecyl trimethyl ammonium bromide (HTAB). In other embodiments, an MML may be included as the surfactant in the ELESS plating bath. Embodiments of an MML are described above. Additionally, the inclusion of the MML as the surfactant may also, in practice, allow for the formation of an MML on dielectric regions. This may proceed substantially simultaneously with ELESS processes when MML compositions are included in ELESS plating baths. In this manner, a number of process steps may be reduced or eliminated thus providing for more optimized manufacturing processes.

It may be appreciated that in embodiments where the ELESS plating bath includes stabilizers, the concentrations of stabilizers are critical to achieve acceptable process results. For example, if a stabilizer concentration is too high, adsorbed stabilizer may dominate the number of catalytic sites available for the dehydrogenation of hypophosphite, which may completely inhibit the plating reaction. On the other hand, if stabilizer concentration is too low, the stabilizer may not be effective. In embodiments, the concentration range of MBT is approximately 0.1 ppm to 0.25 ppm, more preferably approximately 0.1 ppm. The concentration of the surfactant should also be controlled. In some embodiments, the concentration range of HTAB is approximately 1 ppm to 2 ppm. In one particular embodiment, the formulation may be similar to those described above where, the Co ion source includes an approximately 0.02M to 0.1M solution $Co(OH)_2$, more preferably 0.035M solution of $Co(OH)_2$; the complexing agent includes an approximately 0.1M to 0.50M solution of citric acid, more preferably 0.21M solution of citric acid; the buffer includes an approximately 0.1M to 0.50M solution of boric acid, more preferably 0.15M solution of boric acid; the W ion source includes an approximately 0.01M to 0.10M solution of $WO_3$ in tetramethylammonium hydroxide (TMAH), more preferably 0.035M solution of $WO_3$; the reducing agent is formed of two components, a P source including an approximately 0.1M to 0.5M solution of hypophosphorous acid, more preferably 0.145M solution of hypophosphorous acid and a B source including an approximately 0.01 M to 0.10M solution of dimethylamine borane (DMAB) more preferably 0.023M solution of DMAB; a stabilizer source in a concentration of approximately 0.1 ppm to 0.25 ppm of MBT, more preferably a concentration of approximately 0.1 ppm of MBT; and a surfactant source in a concentration of approximately 1 ppm to 2 ppm of HTAB.

Experimental Data

Various concentrations of surfactants and stabilizers were added to an ELESS plating bath at 75° C. A 0.01 g/l solution of $PdCl_2$ was added to the resulting compositions. The time to visible precipitate formed was then recorded for each composition. The results are illustrated in the following table:

TABLE 1

| Sample # | ELESS Plating Solution | Time to precipitate |
|---|---|---|
| 1 | No Additives | 7 sec. |
| 2 | MBT only (stabilizer) - 0.05 ppm | 7 sec. |
| 3 | MBT only (stabilizer) - 0.1 ppm | 35 sec. |
| 4 | HTAB only (surfactant) - 2 ppm | 10 sec. |
| 5 | MBT - 0.1 ppm and HTAB - 2 ppm | >5 min. |

As may be seen for sample 5, a combination of surfactant and stabilizer in the illustrated concentrations yields an ELESS plating solution that does not precipitate for significantly longer than any other formulation utilizing no additives (sample 1), only stabilizers (samples 2 and 3), or only surfactants (sample 4).

At a next step 120, the method performs an ELESS process to form a capping layer on a conductive surface of the patterned substrate. In embodiments, the ELESS process occurs at a temperature in a range of approximately 70° C. to 80° C., over a period of approximately 30 seconds. In some embodiments, a capping layer may include: CoWPB, CoWP, and CoWB. In some embodiments, a capping layer of CoWPB is a composition of approximately 90% to 92% Co, approximately 1% to 2% W, approximately 1% B, and approximately 6% to 7% P. In some embodiments, the capping layer is formed to a thickness of less than approximately 100 Å. In addition, ELESS processes may be performed in any manner without departing from the present invention including: full or partial immersions, spray washing, and spin coating. At a next step 122, the method determines whether to remove the MML. If the method determines at a step 122 not to remove the MML, the method ends. If the method determines at a step 122 to remove the MML, the method optionally continues to a step 124 to remove the MML. An MML may be removed from the substrate in any manner known in the art without departing from the present invention.

Figure 2A:
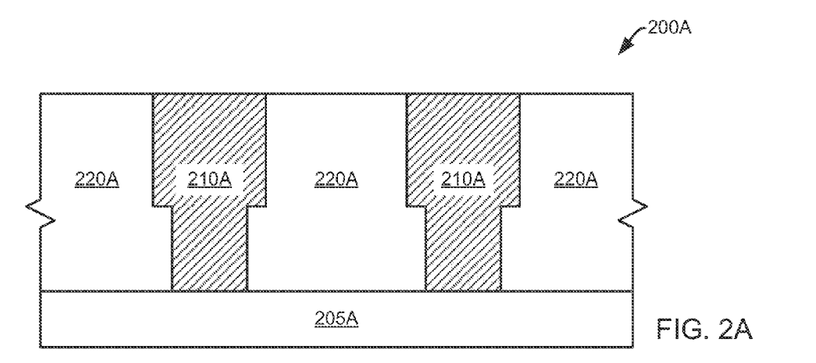
FIGS. 2A-C are illustrative cross-sectional representations of a portion of a substrate having conductive regions and dielectric regions in accordance with embodiments of the present invention.

FIG. 2A is an illustrative cross-sectional representation of a portion of a substrate 200A having conductive regions 210A and dielectric regions 220A as in at a step 102 (see FIG. 1) in accordance with embodiments of the present invention. A single layer is illustrated, but embodiments provided herein may equally apply to one or many layers without departing from the present invention. In some embodiments, substrate 200A may include an electronic device and may be made, in whole or in functionally significant part, of semiconductor material or materials. As illustrated, conductive regions 210A and dielectric regions 220A are formed over base 205A, which may be conductive in some embodiments. Thus, for example, conductive regions 210A may form interconnections between base 205A and other electrically conductive materials subsequently formed as part of substrate 200A. In addition, dielectric regions 220A may be interleaved with conductive regions 210A forming a patterned substrate having one or more topographical features. In some embodiments, hydrophobic properties of dielectric materials may present challenges in process integration within aqueous semiconductor processes. For example, aqueous processes that access the conductive regions 210A may be repelled by the hydrophobic properties of the dielectric regions 220A and may therefore not fully react with the conductive regions 210A.

In some embodiments, conductive regions 210A may be formed from copper, aluminum, other metals and alloys including copper alloys such as copper-zinc alloys, copper-calcium alloys, and copper-manganese alloys, or some combination thereof without departing from the present invention. In addition, in some embodiments, dielectric regions 220A may be formed from a low-k dielectric material that is formed from a doped or otherwise modified silicon dioxide-based material ($SiO_2$) or other dielectric materials without departing from the present invention. In some embodiments, dielectric materials may include: low-k porous dielectric material, low-k non-porous dielectric material, SiCN, SiCNH, $SiCH_3$, $SiOCH_3$, SiCOH, porous SiCOH, SiN, SiC, $SiO_2$, fluorinated silica glass (FSG), methyl-silsesquioxane (MSQ), SiLK™ dielectric by Dow Chemical of Midland, Mich., parylene, low-k organic polymers, and other similar materials or combinations thereof. In some embodiments, low-k porous dielectrics may be utilized, have a k value of less than approximately 3.0. Additionally, dielectric regions may include a hard mask layer which is often formed of a silicon-based material like $SiC_x$, $SiN_x$, $SiC_xN_y$, etc., where the variables x and y represent values as appropriate to desired compositions, formed at the surface of low-k dielectric regions.

Figure 2B:
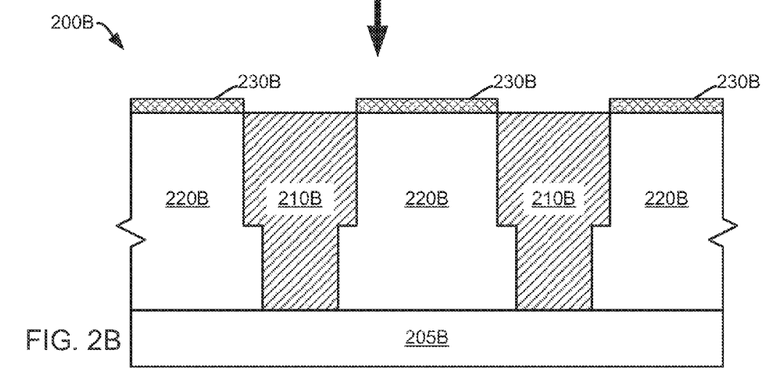

FIG. 2B is an illustrative cross-sectional view of a portion of a substrate 200B having conductive regions 210B, dielectric regions 220B, and an MML 230B, as in at a step 108 (see FIG. 1) in accordance with embodiments of the present invention. In some embodiments, MML 230B is a removable protective coating. As above, conductive regions 210B and dielectric regions 220B are formed over base 205B, which may be conductive in some embodiments. Conductive regions 210B may, for example, form interconnections between base 205B and other electrically conductive materials subsequently formed as part of substrate 200B. In accordance with embodiments presented herein, MML 230B may be applied to a top surface of substrate 200B, which may include both dielectric surfaces and conductive surfaces. In some embodiments, depending upon composition and process times, MML compositions may be selected and/or formulated that do not generally adhere to conductive (e.g., copper) surfaces, but instead adhere selectively to hydrophobic dielectric surfaces. Thus, as shown in FIG. 2B, MML 230B has selectively formed on dielectric regions 220B leaving conductive regions 210B exposed. In other embodiments, an MML composition may be selected to provide a non-selective MML that may adhere both to dielectric regions 220B and to conductive regions 210B (not shown). In a non-selective example, MML formed on a conductive region may require removal from conductive regions before subsequent aqueous processes.

In some embodiments, an MML may include: amphiphilic macromolecules, polyvinyl alcohol (PVA), modified starch compounds, protein compounds, diblock copolymers, triblock copolymers, and dendrimers. In some embodiments, a PVA MML may further include a co-polymer such as: co-ethylene, co-cation, co-siloxane, co-anion (88% hydrolyzed), and co-anion (80% hydrolyzed). In addition, in some embodiments, MMLs may include compounds such as amines, alcohols, isolated silanols, vicinal silanols, and geminal silanols without departing from the present invention. In some embodiments, silanols are compounds having the formula: R—X—$Si(OH)_3$, where R is a hydrophobic group having a formula $O(C_2H_4O)_mCH_3$, where m=an integer greater than zero; and X is an organic group having a formula $(CH_2)_n$, where n=an integer greater than zero. In some embodiments, R is a hydrophilic group. In some embodiments, an MML may include a composition having the formula $C_n$—Si-DMA, where n=4, 8, 12, and 18, which may exhibit protective characteristics when utilized in combination with various aqueous processes. In some embodiments, the MML is hydrophilic.

Figure 2C:
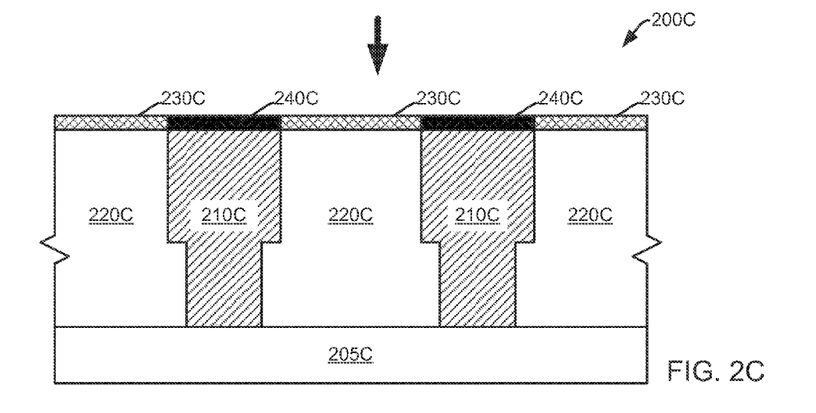

FIG. 2C is an illustrative cross-sectional view of a portion of a substrate 200C having conductive regions 210C, dielectric regions 220C, an MML 230C, and a capping layer 240C as in at a step 120 (see FIG. 1) in accordance with embodiments of the present invention. As above, conductive regions 210C and dielectric regions 220C are formed over base 205C, which may be conductive in some embodiments. Conductive regions 210C may, for example, form interconnections between base 205C and other electrically conductive materials subsequently formed as part of substrate 200C. In some embodiments, a capping layer may include: CoWPB, CoWP, and CoWB. In some embodiments, a capping layer of CoWPB is a composition of approximately 90% to 92% Co, approximately 1% to 2% W, approximately 1% B, and approximately 6% to 7% P. In some embodiments, the capping layer is formed to a thickness of less than approximately 100 Å.

Maintaining ELESS Plating Bath pH While Varying Bath Components

As noted above, in some embodiments, it may be desirable to more precisely control ELESS plating bath pH while varying bath components. In a given ELESS plating bath there may include any number of reactants which may contribute to a change in pH. For example, a complexing agent may contribute to pH drop while a Co composition may contribute to a pH rise. Additionally, when reactants exhibit some buffering characteristics, changes in pH may not correspond linearly with changes in reactant volumes. Thus, precise pH control may be difficult to achieve while varying bath components to optimize a particular ELESS plating bath formulation. It is generally accepted that deposition rates may be affected by the pH of a plating bath. Typically, deposition may be optimized over a specific pH range of a particular ELESS plating bath formulation. Thus, in some embodiments, an ELESS plating bath such as those described above, may be adjusted to a pH range of approximately 9.0 pH to 9.2 pH.

In conventional solutions, a pH adjusting fluid may be added to an ELESS plating bath to account for changes in pH. However, adding pH adjusting fluid in response to a change in pH may result in a temporal lag that results in pH oscillation over a less than optimal range. In order to achieve more precise control of pH in an ELESS plating bath, embodiments may be utilized to determine an amount of pH adjusting fluid is added to the bath.

Figure 3:
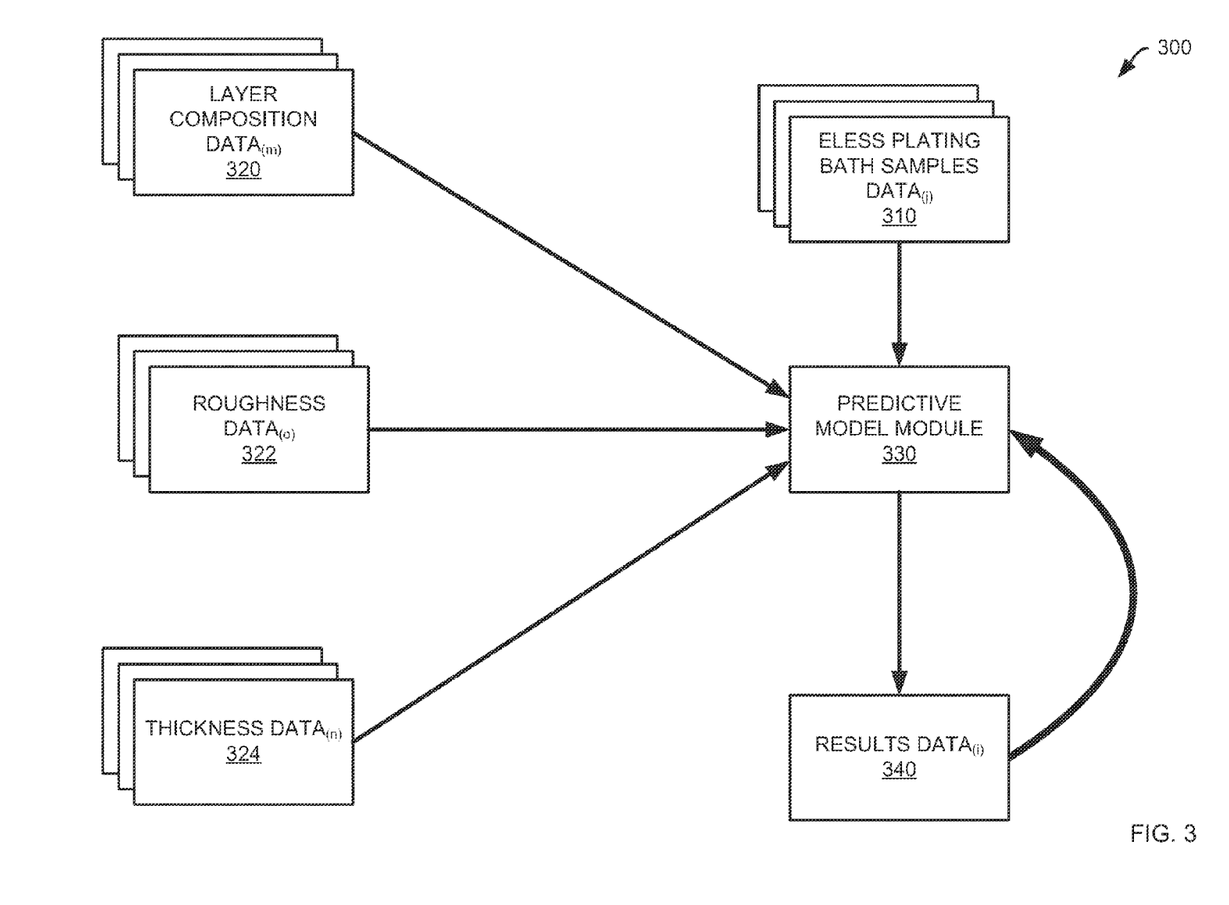
FIG. 3 is an illustrative representation of a system for improving pH control over an ELESS plating bath in accordance with embodiments of the present invention.

FIG. 3 is an illustrative representation of a system 300 for improving pH control over an ELESS plating bath in accordance with embodiments of the present invention. The system includes several inputs namely ELESS plating bath samples data 310; layer composition data 320; roughness data 322; and thickness data 324. In embodiments, ELESS plating bath samples data 310 includes pH data generated from ELESS plating baths having the same formulation, that being the same "recipe" of components, but the relative amounts of the components of the formulation are varied or one of the components can be substituted with an alternative component. Thus, for example an ELESS plating bath formulation that includes a complexing agent may be varied with respect to the complexing agent, either by the amount of complexing agent in the formulation or by varying the complexing agent itself. The pH of the varied bath may then be tested, tabulated, and modeled in predictive modeling module 330. In this manner, the relationship of a complexing agent on pH change may be established. In some embodiments, data may be gathered utilizing combinatorial techniques, which provide for rapid testing of many samples. Predictive modeling module 330 may then be utilized to determine what amount of component solutions will affect pH in a given ELESS plating bath. In some embodiments, any ELESS plating bath composition such as those described for embodiments above may be tested and tabulated. Additional inputs may then be utilized to extend predictive models more thoroughly. For example, layer composition data 320 may include data describing layer compositions with respect to pH. For example, in an embodiment of an ELESS plating bath that includes a phosphorous containing compound, a measured percentage of phosphorous of a deposited layer may be determined with respect to pH. Layer composition data 320 may then be integrated into predictive modeling module 330 to determine how a layer's composition will change with changes to an ELESS plating bath composition as a function of pH thereby creating a new and more robust predictive model. In this manner, control of plating processes may proceed through various means as indicated by predictive modeling module 330. For example, a desired layer composition may be selected whereupon an ELESS plating solution may be pH adjusted to meet the desired layer composition criteria.

In another example, roughness data 322 may include data describing roughness of a formed layer with respect to pH. For example, in an embodiment, a degree of roughness of a deposited layer may be determined with respect to pH. Roughness data 322 may then be integrated into predictive modeling module 330 to determine how a layer's roughness will change with changes to an ELESS plating bath composition as a function of pH thereby creating a new and more robust predictive model. In this manner, control of plating processes may proceed through various means as indicated by predictive modeling module 330. For example, a desired roughness may be selected whereupon an ELESS plating solution may be pH adjusted to meet the desired roughness criteria.

In like manner, in yet another example, thickness data 324 may include data describing thickness of a formed layer with respect to pH. For example, in an embodiment, a thickness of a deposited layer may be determined with respect to pH. Thickness data 324 may then be integrated into predictive modeling module 330 to determine how a layer's thickness will change with changes to an ELESS plating bath composition as a function of pH thereby creating a new and more robust predictive model. In this manner, control of plating processes may proceed through various means as indicated by predictive modeling module 330. For example, a desired thickness may be selected whereupon an ELESS plating solution may be pH adjusted to meet the desired thickness criteria.

Once appropriate inputs are selected, predictive modeling module 330 may be utilized define a set of operational parameters, which correspond with selected input data. A process run may then be defined based on generated operational parameters, which will, in turn, generate results data 340. Results data 340 may then be utilized as feedback into predictive modeling module 330, which may, in some embodiments, further improve the new predictive models.

While this invention has been described in terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for improving selective deposition of a capping layer on a patterned substrate, the method comprising:
   receiving the patterned substrate, the patterned substrate comprising a conductive region and a dielectric region followed by;
   forming a molecular masking layer (MML) on the dielectric region followed by;
   removing unattached MML by pre-cleaning, followed by;
   before reacting and/or contacting the patterned substrate with a plating bath, preparing an electroless (ELESS) plating bath, wherein the ELESS plating bath comprises:
      a stabilizer comprising 2-mercapto benzothiazole (MBT) having a concentration of 0.1 ppm;
      a cobalt (Co) ion source:
      a complexing agent:
      a buffer:
      a tungsten (W) ion source:
      a reducing agent; and
      a surfactant comprising Hexadecyl trimethyl ammonium bromide (HTAB) having a concentration of 2 ppm, followed by;
   reacting the patterned substrate with the ELESS plating bath for an ELESS period at an ELESS temperature and an ELESS pH such that the capping layer is selectively formed on the conductive region,
   wherein the MML comprises a silanol having the formula:

R—X—Si(OH)$_3$, wherein

R is a hydrophobic group having a formula $O(C_2H_4O)_m CH_3$ where m=an integer greater than zero; and
   X is an organic having a formula $(CH_2)_n$ where n=an integer greater than zero.

2. The method of claim 1, wherein the ELESS plating bath is prepared to further comprise a pH adjuster for adjusting the ELESS pH to a range of approximately 9.0 to 9.2.

3. The method of claim 2 wherein the pH adjuster is tetramethylammonium hydroxide (TMAH).

4. The method of claim 1, wherein the MML is hydrophilic.

5. The method of claim 1, wherein the MML comprises polyvinyl alcohol (PVA).

6. The method of claim 5, wherein the PVA includes a co-polymer selected from the group consisting of: co-ethylene, co-cation, co-siloxane, co-anion (88% hydrolyzed), and coanion (80% hydrolyzed).

7. The method of claim 1, wherein the pre-cleaning includes pre-cleaning the patterned substrate for a pre-cleaning period; and rinsing the patterned substrate for a rinsing period.

8. The method of claim 1, further comprising cross-linking the MML by a thermal cure wherein the thermal cure occurs over a cross-linking period of approximately 300 seconds at a cross-linking temperature of approximately less than 120 degree C. to 300 degree C.

9. The method of claim 1, further comprising cross-linking the MML utilizing a cross-linking agent selected from the group consisting of: glutaraldehyde, dialdehydes, sulfuric acid ($H_2SO_4$), maleic acid, citric acid, tetrabutylammonium acetate, and ascorbic acid, wherein the cross-linking occurs over a crosslinking period in a range of approximately 30 seconds to 600 seconds.

10. A method for improving selective deposition of a CoWPB capping layer on a patterned substrate, the method comprising:

receiving the patterned substrate comprising a conductive region and a dielectric region followed by;

forming a molecular masking layer (MML) on the dielectric region, wherein the MML comprises a silanol having the formula:

R—X—Si(OH)$_3$, wherein

R is a hydrophobic group having a formula $O(C_2H_4O)_m CH_3$ where m=an integer greater than zero; and X is an organic having a formula $(CH)_n$ where n=an integer greater than zero followed by;

removing unattached MML by pre-cleaning, followed by;

before reacting and/or contacting the patterned substrate with a plating bath, preparing an electroless (ELESS) plating bath, wherein the ELESS plating bath comprises:

a cobalt (Co) ion source of an approximately 0.02M to 0.10M solution of $Co(OH)_2$:

a complexing agent of an approximately 0.1M to 0.50M solution of citric acid:

a buffer of an approximately 0.1M to 0.50M solution of boric acid:

a tungsten (W) ion source of an approximately 0.01M to 0.1M solution of $WO_3$ in tetramethylammonium hydroxide (TMAH):

a reducing agent of an approximately 0.01M to 0.1M solution of p-dimethylamine borane (DMAB) and an approximately 0.1M to 0.5M solution of hypophosphourous acid; and a stabilizer comprising 2-mercapto benzothiazole (MBT) having a concentration of 0.1 ppm;

a surfactant comprising Hexadecyl trimethyl ammonium bromide (HTAB) having a concentration of 2 ppm, followed by;

reacting the patterned substrate with the ELESS plating bath for an ELESS period at an ELESS temperature and an ELESS pH such that the CoWPB capping layer is selectively formed on the conductive region.

11. The method of claim 10, wherein the ELESS plating bath is prepared to further comprise a pH adjuster for adjusting the ELESS pH to a range of approximately 9.0 to 9.2.

12. The method of claim 10, wherein the ELESS temperature is in a range of approximately 700 C to 800 C, and the ELESS time period is approximately 30 seconds.

\* \* \* \* \*